United States Patent
Oguz et al.

(10) Patent No.: US 11,031,545 B2
(45) Date of Patent: Jun. 8, 2021

(54) HIGH STABILITY FREE LAYER FOR PERPENDICULAR SPIN TORQUE TRANSFER MEMORY

(71) Applicant: INTEL CORPORATION, Santa Clara, CA (US)

(72) Inventors: Kaan Oguz, Portland, OR (US); Kevin P. O'Brien, Portland, OR (US); Brian S. Doyle, Portland, OR (US); Mark L. Doczy, Beaverton, OR (US); Charles C. Kuo, Hillsboro, OR (US); Daniel G. Ouellette, Portland, OR (US); Christopher J. Wiegand, Portland, OR (US); Md Tofizur Rahman, Portland, OR (US); Brian Maertz, Santa Barbara, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,603

(22) PCT Filed: Sep. 30, 2016

(86) PCT No.: PCT/US2016/054821
§ 371 (c)(1),
(2) Date: Feb. 22, 2019

(87) PCT Pub. No.: WO2018/063338
PCT Pub. Date: Apr. 5, 2018

(65) Prior Publication Data
US 2019/0221734 A1 Jul. 18, 2019

(51) Int. Cl.
*H01L 27/22* (2006.01)
*H01L 43/08* (2006.01)
(Continued)

(52) U.S. Cl.
CPC ............ *H01L 43/08* (2013.01); *H01L 27/228* (2013.01); *H01L 43/10* (2013.01); *H01L 43/12* (2013.01)

(58) Field of Classification Search
CPC ........ H01L 27/228; H01L 43/08; H01L 43/10
(Continued)

(56) References Cited

U.S. PATENT DOCUMENTS 5,678,057 A * 10/1997 Rostoker ................. G06F 13/24
710/48
2002/0045952 A1* 4/2002 Blemel ................ G05B 19/042
700/2

(Continued)

OTHER PUBLICATIONS

PCT/US2016/054821, International Search Report and Written Opinion, dated Apr. 25, 2017, 11 pages.
(Continued)

*Primary Examiner* — Long K Tran
(74) *Attorney, Agent, or Firm* — Schwabe, Williamson & Wyatt, P.C.

(57) ABSTRACT

Systems, apparatus, and methods for magnetoresitive memory are described. An apparatus for magnetoresitive memory includes a fixed layer, a free layer, and a tunneling barrier between the fixed layer and the free layer. The free layer is a new alloy consisting of a composition of Cobalt (Co), Iron (Fe), and Boron (B) intermixed with a non-magnetic metal according to a ratio. A thin insert layer of CoFeB may optionally be added between the alloy and the tunneling barrier.

16 Claims, 15 Drawing Sheets

(51) Int. Cl.
*H01L 43/10* (2006.01)
*H01L 43/12* (2006.01)

(58) Field of Classification Search
USPC .............................................. 257/421; 438/48
See application file for complete search history.

(56) References Cited

U.S. PATENT DOCUMENTS

| | | |
|---|---|---|
| 2008/0080101 A1 | 4/2008 | Mauri et al. |
| 2012/0188818 A1 | 7/2012 | Ranjan et al. |
| 2013/0083048 A1* | 4/2013 | Weiss ................ G11C 13/0002 345/555 |
| 2013/0094108 A1 | 4/2013 | Gao et al. |
| 2015/0061050 A1* | 3/2015 | Zhou ...................... H01L 43/08 257/421 |
| 2015/0249210 A1 | 9/2015 | Zhao et al. |
| 2016/0005955 A1 | 1/2016 | Park et al. |

OTHER PUBLICATIONS

International Preliminary Report on Patentability for International Patent Application No. PCT/US2016/054821, dated Apr. 11, 2019, 8 pgs.

Office Action from Taiwan Patent Application No. 106128141, dated Dec. 15, 2020, 8 pgs.

* cited by examiner

HIGH STABILITY FREE LAYER FOR PERPENDICULAR SPIN TORQUE TRANSFER MEMORY

RELATED APPLICATION(S)

This application is a national stage filing under 35 U.S.C. § 371 of International Patent Application No. PCT/US2016/054821, filed Sep. 30, 2016, which is hereby incorporated by reference herein in its entirety.

TECHNICAL FIELD

The present disclosure relates to magnetic tunnel junctions (MTJs), which is a component that includes two magnetic layers separated by a tunnel barrier (e.g., a thin insulator). The tunnel barrier allows electrons to tunnel from one magnetic layer to the other magnetic layer. Tunnel magnetoresistance (TMR) is a magnetoresistive effect that changes based on the magnetic direction of the two magnetic layers. If the two magnetic layers have the same (parallel) magnetic direction then electrons will tunnel through more easily than if the two magnetic layers are in opposite (antiparallel) magnetic directions. Thus, the MTJ provides two possible states of electrical resistance. In practice, one of the layers (i.e., the free layer) may be selectively switched with respect to a fixed layer. This switchable magnetoresistance may be used in a variety of applications, including memory.

Spin-transfer torque can be used to switch the free layer between the low resistance state and the high resistance state. Charge carriers in an electric current have spin. Typically, the net spin of an electric charge is negligible. However, an electric current can be spin polarized (by passing the current through the fixed layer, for example) so that the charge carriers are predominantly polarized in a single direction. If, a spin polarized current is passed through the free layer, the angular momentum of the spin polarized current is transferred to the free layer, and if it is sufficient, the transferred angular momentum will switch the orientation of the magnetic direction of the free layer to align with the spin polarization of the spin polarized current. Spin polarization can be either in-plane or perpendicular.

The present disclosure relates to perpendicular spin torque transfer memory (pSTTM). In particular, the present disclosure relates to an improved free layer for pSTTM.

DETAILED DESCRIPTION

Figure 1:
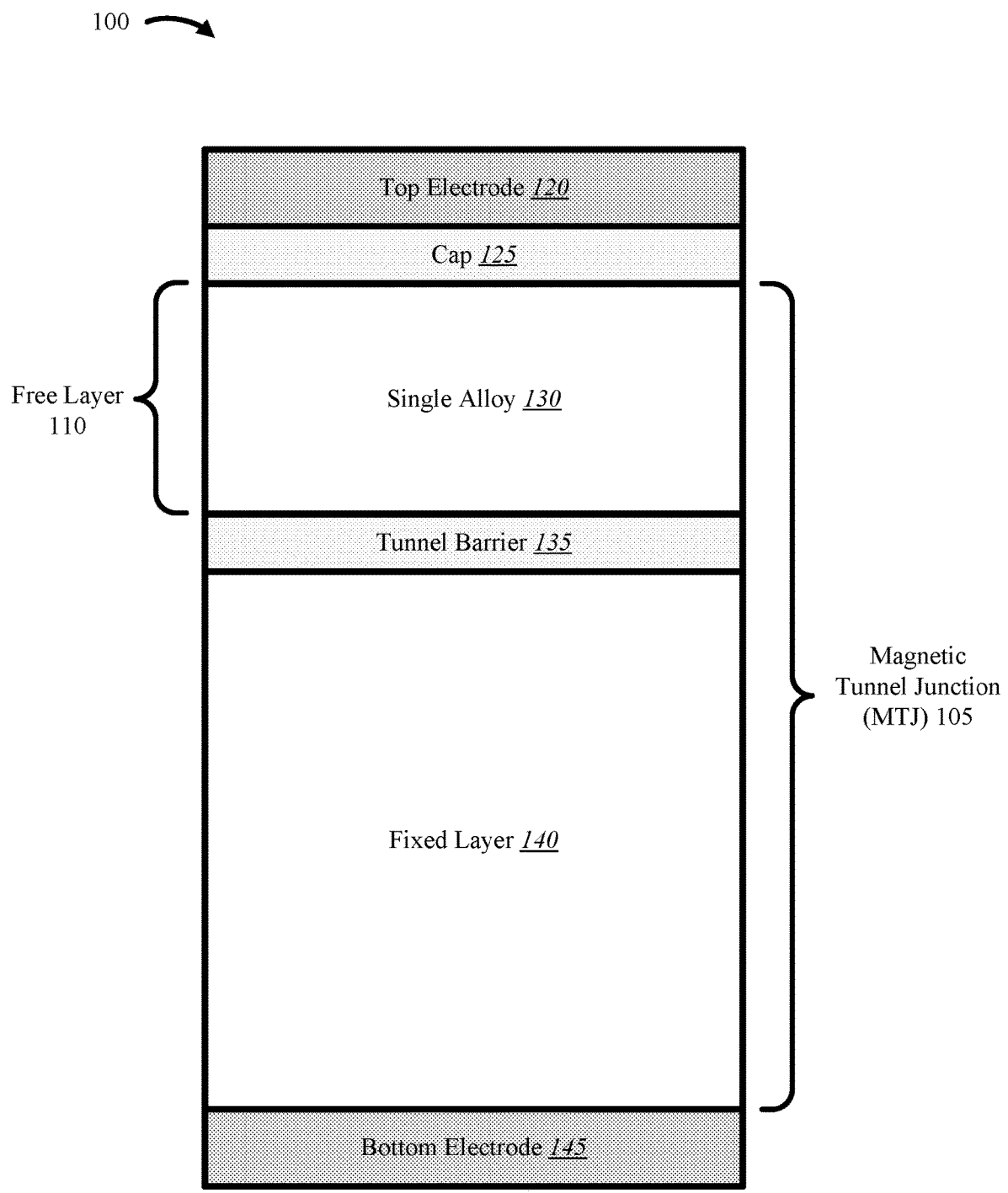
FIG. 1 illustrates a bottom pinned pSTTM stack that uses the single alloy as a single layer free layer.

Described herein are systems and methods of a high stability free layer for a perpendicular spin torque transfer memory (pSTTM) device. The high stability free layer is formed from a magnetic alloy that includes Cobalt (Co), Iron (Fe) and Boron (B) (i.e., CoFeB) in combination with a non-magnetic metal (e.g., Molybdenum (Mo), Tungsten (W), Hafnium (Hf), Niobium (Nb), Tantalum (Ta), Chromium (Cr), and/or the like) according to a ratio. In some embodiments, the ratio is achieved by co-sputtering the CoFeB with the non-magnetic metal. This magnetic alloy improves stability of the pSTTM device while keeping tunnel magnetoresistance (TMR) high and magnetic damping low. This magnetic alloy can also sustain perpendicular anisotropy at 400 degrees Celsius, which is important for inclusion in complementary metal-oxide-semiconductor (CMOS) where backend processing temperatures reach 400 degrees Celsius.

In some embodiments, an insert layer may be added to the magnetic alloy to increase the TMR associated with the free layer. In one example, the insert layer may be a CoFeB insert between the magnetic alloy and a tunnel barrier.

In the following description, various aspects of the illustrative implementations will be described using terms commonly employed by those skilled in the art to convey the substance of their work to others skilled in the art; however, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV semiconductor materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, non-planar transistors, or a combination of both. Non-planar transistors include FinFET transistors such as double-gate transistors and tri-gate transistors, and wrap-around or all-around gate transistors such as nanoribbon and nanowire transistors. Although the implementations described herein do not specifically identify the inclusion of a transistor or comparable switchable device, it is well known in the art how STTM including pSTTM may be implemented (into CMOS, for example) using such devices.

A conventional pSTTM free layer stack uses a non-magnetic insert to achieve perpendicular anisotropy. For example, a conventional pSTTM free layer stack includes a first CoFeB layer and a second CoFeB layer with a non-magnetic insert layer (e.g., 0.4 nanometers (nm) of Mo) between the two CoFeB layers (i.e., a tri-layer stack). These conventional stacks suffer from low stability because of high magnetization of the free layer.

Stability is one of the key metrics for pSTTM and refers to the retention time of the magnetization (how long can the magnetic moment stay in that direction or how long can the free layer keep its state, for example). Since higher stability numbers represent better memory retention, higher stability numbers are desirable since they achieve longer memory retention times. Stability of a pSTTM free layer is given by equation (1), provided below.

$$\text{Stability} = \text{Area} * K_{eff} * t_{mag} = \text{Area} * [K_i - ((N_z N_x) M_s^2 t_{mag} \mu_0 / 2)] \quad \text{Equation (1)}$$

As set forth in equation (1), stability is a function of the area of the magnetic layer (i.e., Area, length times width, for example), the effective magnetic anisotropy of the magnetic layer (i.e., $K_{eff}$, the hold of the magnetism in a particular direction (e.g., perpendicular direction), for example), and the thickness of the magnetic layer (i.e., $t_{mag}$). In the equation, $K_{eff} * t_{mag}$ is defined as $K_i - ((N_z - N_x) M_s^2 t_{mag} \mu_0 / 2)$ where $K_i$ is the interface anisotropy, $N_z$ is the demagnetization in the Z direction (i.e., perpendicular direction), $N_x$ is the demagnetization in the X direction (i.e., in-plane direction), and $M_s$ is the saturation magnetization of the magnetic free layer, and $\mu_0$ is the magnetic permeability of free space.

Based on equation (1), changing the magnetic saturation $M_s$ can make a big impact on stability, especially since the value of $M_s$ is squared. As can be appreciated from equation (1), reducing the value of $M_s$ reduces the negative term that is subtracted from $K_i$, thus increasing $K_{eff}$ and as a result increasing the stability. So a material with lower $M_s$ is desirable for increasing stability if $K_i$ is unchanged.

In addition, the demagnetization factors $N_z$ and $N_x$ are dependent upon thickness. As discussed herein, the described systems and methods further allow for increased thickness of films, which lowers the demagnetization factors (i.e., $N_z$ and $N_x$) resulting in increased stability. So a material that allows for thicker layers is also desirable for increasing stability.

The present systems and methods relate to a material (e.g., a new alloy) that has a lower $M_s$. The lower $M_s$ is achieved by forming an alloy that combines CoFeB with a non-magnetic material according to a particular ratio. In one example, the alloy takes the form set forth in equation (2) below.

$$(Co_{20}Fe_{60}B_{20})_{100-x}(\text{Non-magnetic metal})_x \quad \text{Equation (2)}$$

In equation (2), x represents the ratio of the non-magnetic metal to the CoFeB alloy. For example, if x=9, then the ratio is 91% CoFeB with 9% non-magnetic metal. The non-magnetic metal may be any of a variety of non-magnetic metals. Examples of non-magnetic metals include Molybdenum (Mo), Tungsten (W), Hafnium (Hf), Niobium (Nb), Chromium (Cr), and Tantalum (Ta). In equation (2), the CoFeB alloy is defined as $Co_{20}Fe_{60}B_{20}$ (e.g., 20% Cobalt (Co), 60% Iron (Fe), and 20% Boron (B)). While many of the example embodiments described herein use the $Co_{20}Fe_{60}B_{20}$ alloy composition, it is understood that this is just one example of a CoFeB alloy composition, and that a variety alternative CoFeB alloy compositions could also be used. Examples of alternative CoFeB alloy compositions include, but are not limited to, $Co_{60}Fe_{20}B_{20}$, $Co_{40}Fe_{40}B_{20}$, $Co_{10}Fe_{70}B_{20}$, and $Fe_{80}B_{20}$ (i.e., $Co_0Fe_{80}B_{20}$).

It is appreciated that this new alloy of CoFeB combined with a non-magnetic metal according to a ratio may be used to form a single layer free layer. A single layer free layer is simpler to manufacture/produce than the tri-layer (or multi-layer) free layers that are used currently. The single layer free layer of this new alloy is additionally beneficial because it allows for a thicker layer (e.g., film) to be used, which, as discussed above, enables improved stability. As will be described below, there are many factors that should be considered in selecting the non-magnetic metal, $M_s$, thickness, etc.

In some cases, the new alloy may have a slightly reduced TMR as compared to the current tri-layer free layer mentioned previously. In some cases, a thin magnetic layer (of CoFeB, for example) may be inserted between the new alloy and the tunnel barrier to increase the TMR of the combined new alloy and insert layer free layer so as to be on par with TMR values of the current tri-layer free layer.

It is appreciated that a thin insert layer of CoFeB may be created by having a zero ratio of the non-magnetic metal for a period of time during deposition. So this bi-layer may be formed during the same deposition process by simply selecting a zero ratio for a first period (to create the CoFeB insert, for example) and a non-zero ratio for a second period (to create the new alloy with the CoFeB co-sputtered with the non-magnetic metal, for example).

Referring now to the figures, FIG. 1 illustrates a bottom pinned pSTTM stack 100 that uses a single alloy 130 as a single layer free layer 110. The bottom pinned pSTTM stack 100 includes an MTJ 105 with the free layer 110 and a fixed layer 140 separated by a tunnel barrier 135. The MTJ 105 may be between a top electrode 120 and a bottom electrode 145. A cap 125 may separate the free layer 110 from the top electrode 120.

As illustrated in FIG. 1, the free layer 110 is a single layer free layer that consists of the single alloy 130. The single alloy 130 may be the new alloy discussed previously. For example, the single alloy 130 may be a single alloy as set forth in equation (2). For example, the single alloy 130 may be $(Co_{20}Fe_{60}B_{20})_{100-x}Mo_x$ where x is between 2 and 15 inclusive (e.g., between 2% and 15% inclusive). In another example, x is between 8 and 10 inclusive (e.g., between 8% and 10% inclusive). In some embodiments, the single alloy 130 is between 1 and 3 nanometers (nm) in thickness inclusive. In other embodiments, the single alloy 130 may be larger than 3 nm in thickness.

Figure 2:
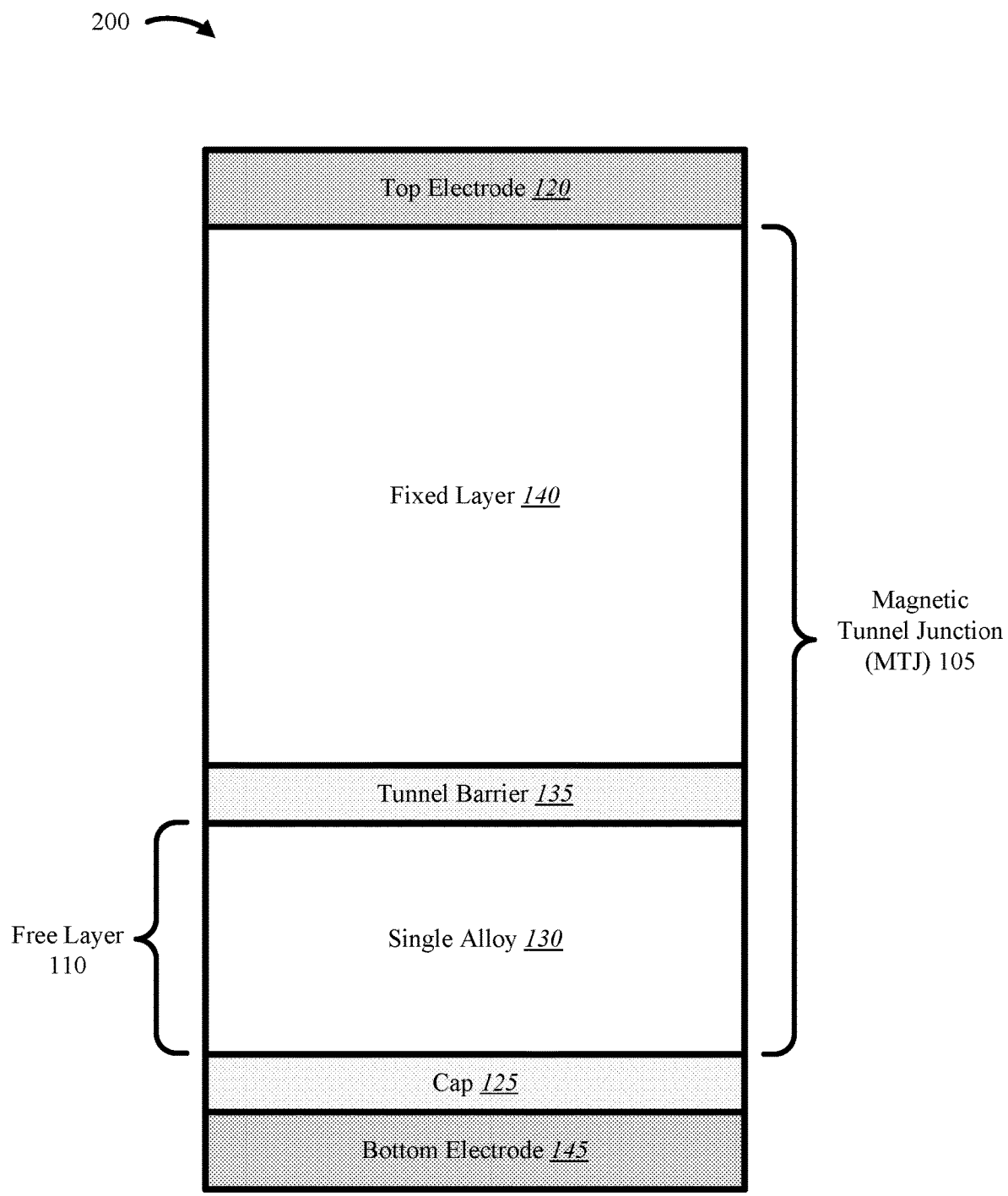
FIG. 2 illustrates a top pinned pSTTM stack that uses the single alloy as a single layer free layer.

FIG. 2 illustrates a top pinned pSTTM stack 200 that uses the single alloy 130 as a single layer free layer 110. FIG. 2 includes all of the same components as discussed with respect to FIG. 1 except that the fixed layer 140 of the MTJ 105 is pinned to the top electrode 120 (the MTJ 105 is top pinned, for example) rather than pinned to the bottom electrode 145 (the MTJ 105 is bottom pinned, for example) as illustrated in FIG. 1. Thus, the single layer free layer 110 consisting of only the single alloy 130 can be included in both bottom pinned and top pinned MTJ 105 configurations.

Figure 3:
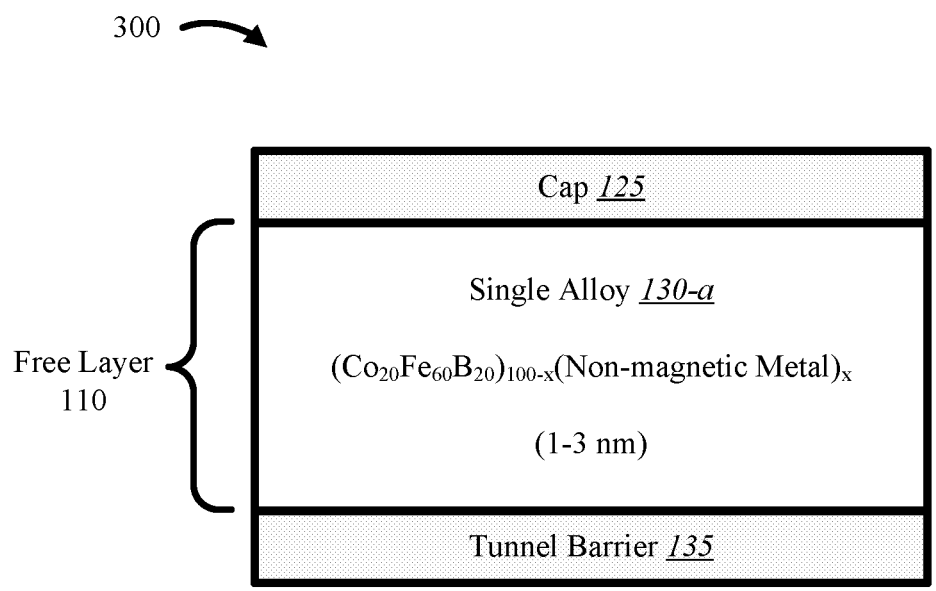
FIG. 3 illustrates a single layer free layer stack that includes the single alloy between a cap and the tunnel barrier.

FIG. 3 illustrates a single layer free layer stack 300 that includes the single alloy 130-a between the cap 125 and the tunnel barrier 135. The single alloy 130-a is an example of the single alloy 130 illustrated with respect to FIGS. 1 and/or 2. The single alloy 130-a is composed of the new alloy that is formed by combining CoFeB with a non-magnetic metal according to a specific ratio. As discussed previously, the non-magnetic metal may be any of a variety of non-magnetic metals, including Molybdenum (Mo), Tungsten (W), Hafnium (Hf), Niobium (Nb), Chromium (Cr), and Tantalum (Ta). In the single alloy 130-a, the single alloy 130-a has a thickness of 1 to 3 nm.

Figure 4:
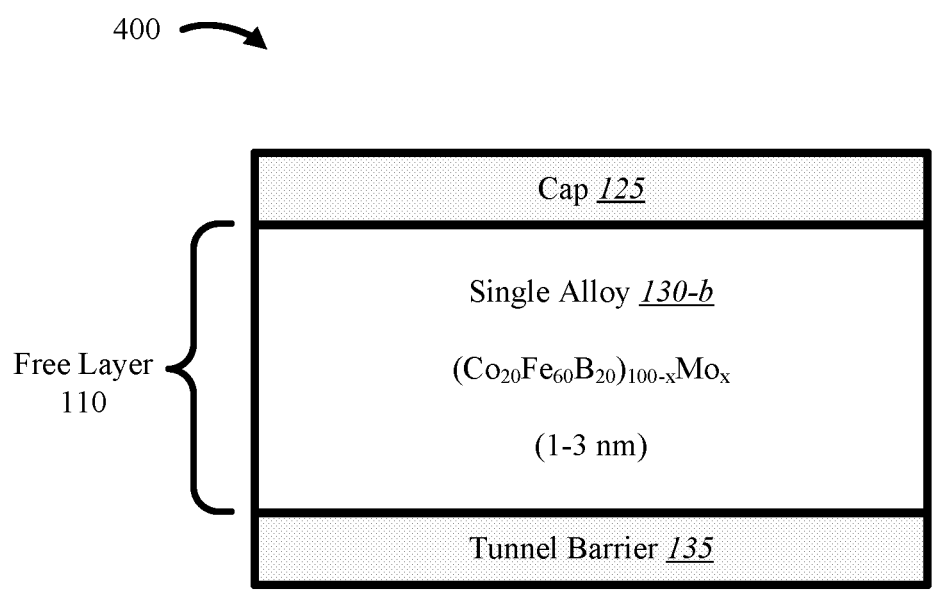
FIG. 4 illustrates one example of the single layer free layer stack that was illustrated with respect to FIG. 3 in which Molybdenum (Mo) is selected as the non-magnetic metal in the single alloy.

FIG. 4 illustrates one example of a single layer free layer stack 400 that was illustrated with respect to FIG. 3 in which Molybdenum (Mo) is selected as the non-magnetic metal in the single alloy 130-b. Although the following examples are based on the use of Molybdenum as the non-magnetic metal of the single alloy 130-b, it is understood that other non-magnetic metals may be used with similar results.

Figure 5:
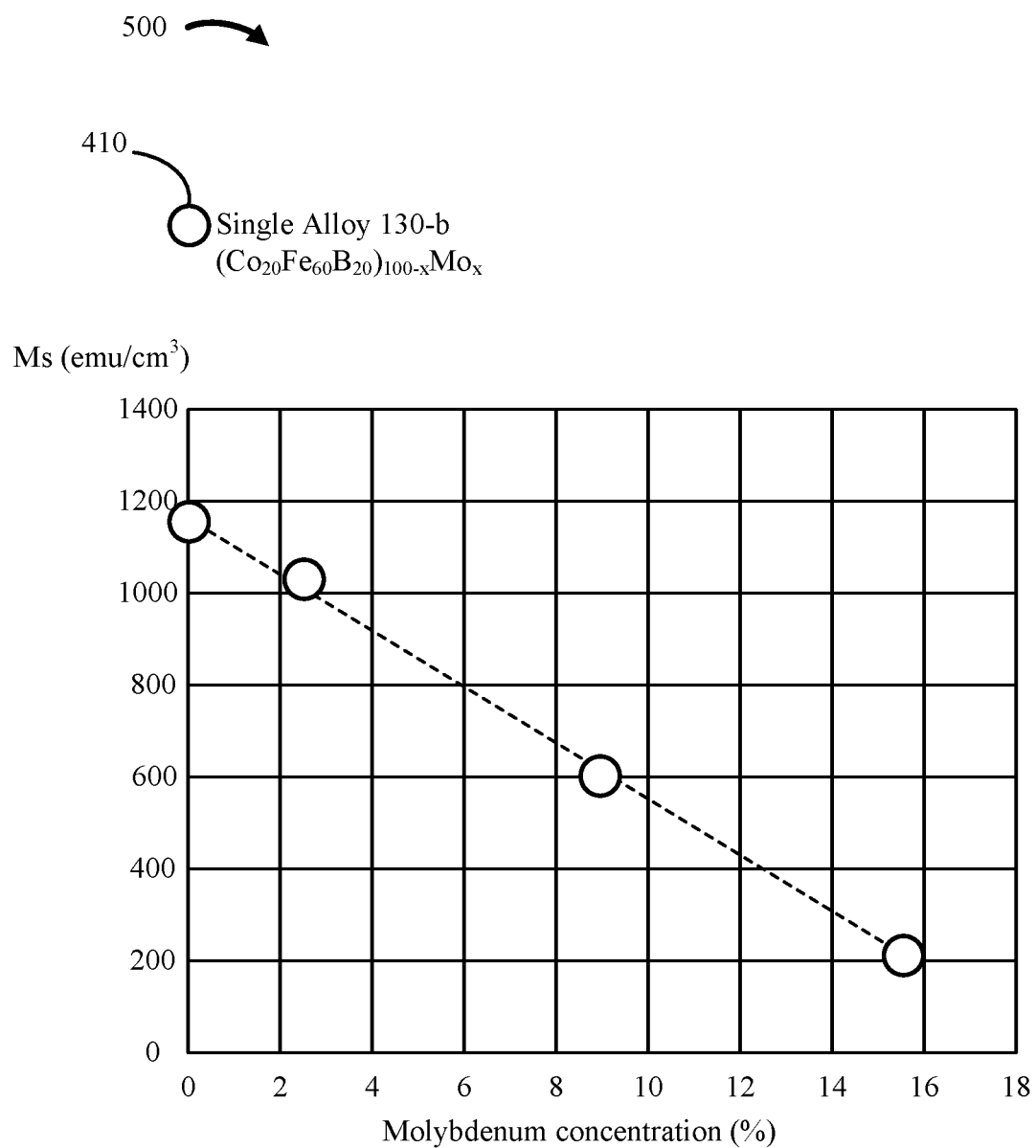
FIG. 5 illustrates a graph of saturation of magnetization $M_s$ levels for various ratios of Molybdenum (Mo) for a single layer free layer of single alloy.

FIG. 5 illustrates a graph 500 of saturation of magnetization $M_s$ levels for various ratios of Molybdenum (Mo) for a single layer free layer 410 of the single alloy 130-b. As illustrated in FIG. 5, a zero ratio of Molybdenum (Mo) concentration is simply an alloy of $Co_{20}Fe_{60}B_{20}$ with an associated $M_s$ of just under 1200 emu/cm³. As the concentration of Molybdenum (Mo) increases, the $M_s$ of the resulting alloy has a lower and lower $M_s$. For instance, when x equals a little more than 2 (i.e., a little over 2% Molybdenum concentration), then the $M_s$ of the resulting alloy (e.g., $(Co_{20}Fe_{60}B_{20})_{97.8}Mo_{2.2}$) is about 1010 emu/cm³. When x equals 9 (i.e., 9% Molybdenum concentration), then the $M_s$ of the resulting alloy (e.g., $(Co_{20}Fe_{60}B_{20})_{91}Mo_9$) is about 600 emu/cm³. Similarly, when x equals 15.5 (i.e., 15.5% Molybdenum concentration), then the $M_s$ of the resulting alloy (e.g., $(Co_{20}Fe_{60}B_{20})_{84.5}Mo_{15.5}$) is about 200 emu/cm³. Thus, as illustrated in the graph 500, the saturation of magnetization decreases (substantially) linearly as the concentration of Molybdenum (Mo) increases. It is noted that there are multiple considerations that should be considered when selecting the parameters such as which non-magnetic metal, concentration of the non-magnetic metal, thickness of the single alloy 130, etc. A few of these considerations are discussed below.

Figure 6:
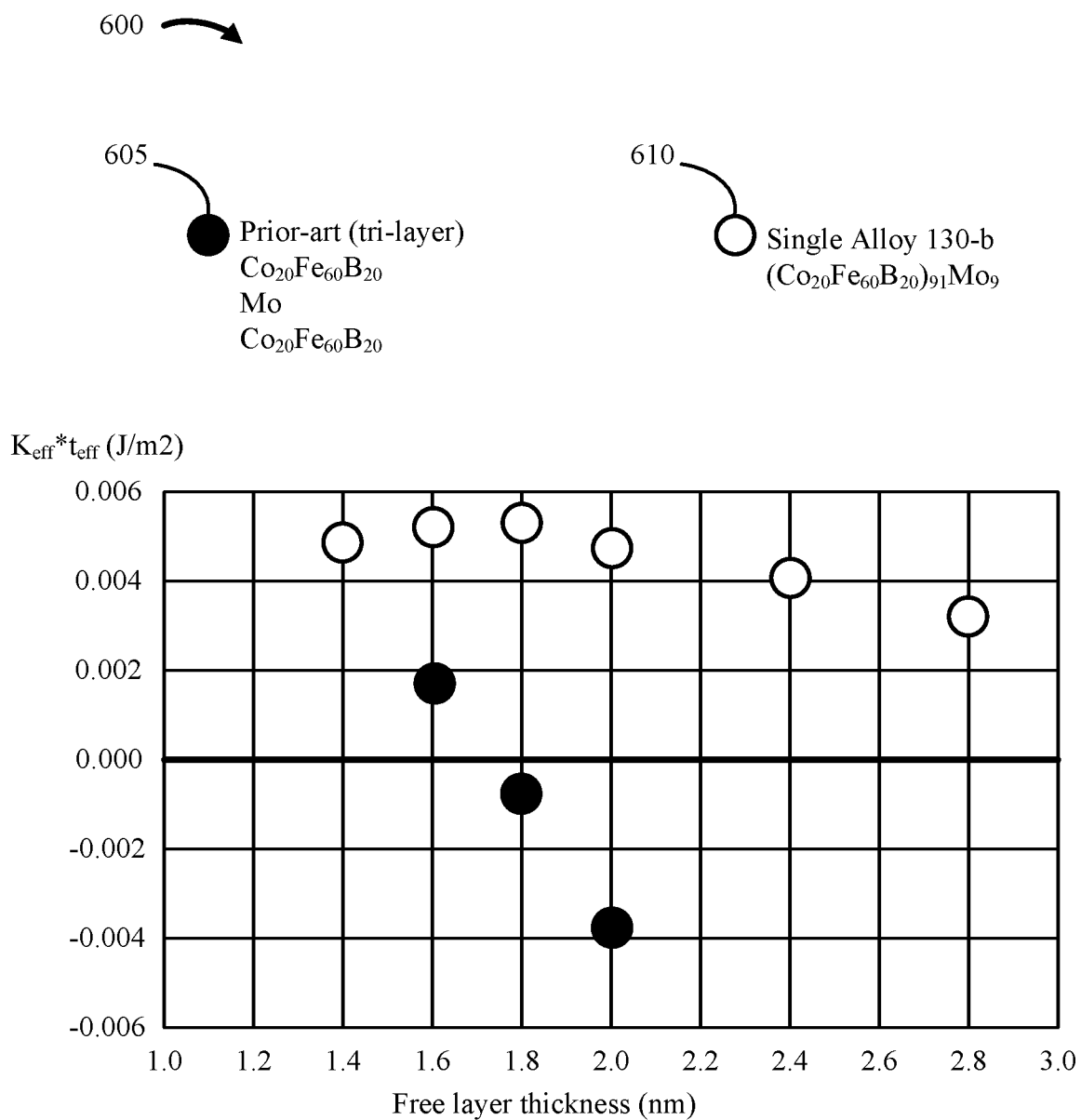
FIG. 6 illustrates a graph of $K_{eff}*t_{eff}$ values with respect to free layer thickness for both the prior-art (tri-layer) and a single layer free layer of a particular single alloy.

FIG. 6 illustrates a graph 600 of $K_{eff}*t_{eff}$ values with respect to free layer thickness for both the prior-art (tri-layer) 605 and a single layer free layer 610 of a particular single alloy 130-b. As illustrated in FIG. 6, the particular single alloy 130-b in this example is $(Co_{20}Fe_{60}B_{20})_{91}Mo_9$ (i.e., x=9 and the non-magnetic metal is Molybdenum (Mo) in equation (2)). It should be appreciated that positive values of $K_{eff}*t_{eff}$ represent perpendicular anisotropy whereas negative values of $K_{eff}*t_{eff}$ represent in-plane anisotropy. So for pSTTM, larger positive values are desired (as set forth in equation (1), larger positive values increase stability).

This also means that the prior art (tri-layer) 605 only has perpendicular anisotropy for thicknesses that are in the narrow range around 1.6 nm. In contrast, the single layer free layer 610 of the single alloy 130-b has larger positive $K_{eff}*t_{eff}$ values in a much larger thickness range, which is superior to the prior art (tri-layer) 605. The values of $K_{eff}*t_{eff}$ are expressed in units of Joules per meter squared (J/m²).

Figure 7:
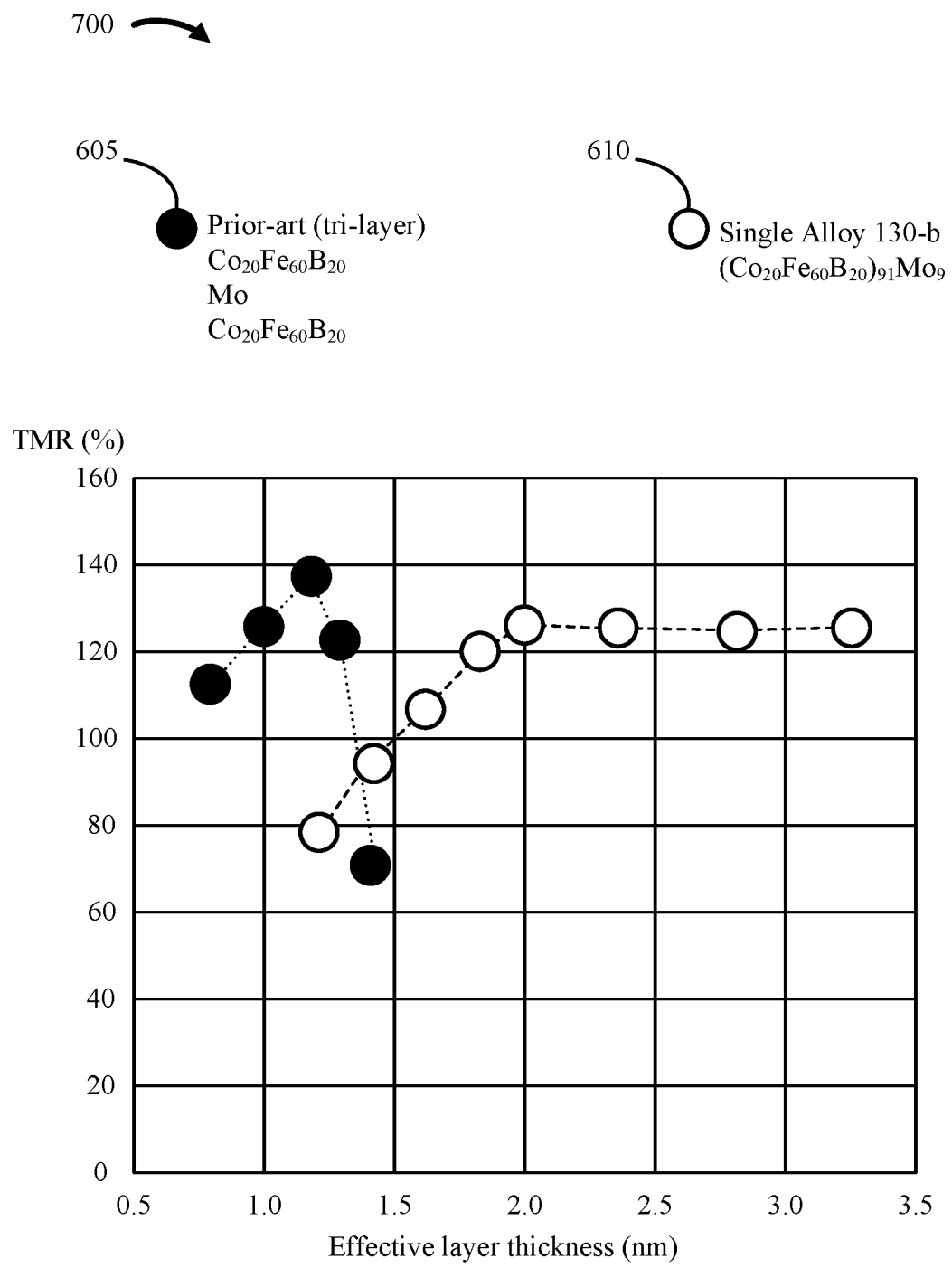
FIG. 7 illustrates a graph of tunnel magnetoresistance (TMR) for various effective layer thicknesses for both the prior art (tri-layer) and the single layer free layer of single alloy.

FIG. 7 illustrates a graph 700 of tunnel magnetoresistance (TMR) for various effective layer thicknesses for both the prior art (tri-layer) 605 and the single layer free layer 610 of the single alloy 130-b. As illustrated in FIG. 7, the prior art (tri-layer) 605 has a peak TMR at 140% whereas the single layer free layer 610 peaks at about 125%, which is a bit lower than the peak TMR of the prior art (tri-layer) 605. Higher TMR values are desirable. Although the TMR associated with the single alloy 130-b, is a bit lower, it is still in an acceptable (e.g., good) range for use.

As noted above, in some embodiments, the TMR can be increased back to prior art levels (140%, for example) by inserting a very thin CoFeB insert layer between the invention alloy and the tunnel barrier, as illustrated in the following FIGS.

Figure 8:
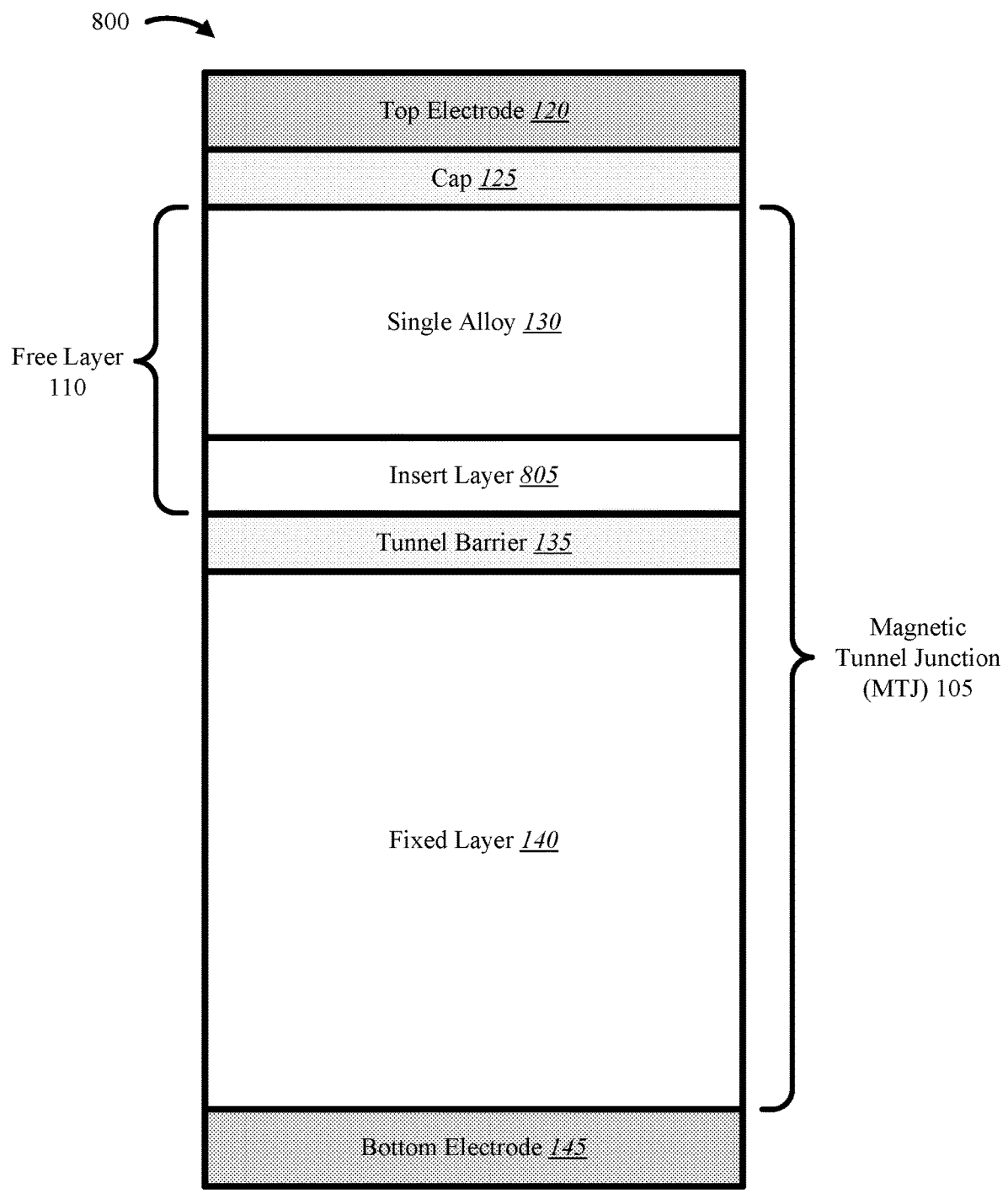
FIG. 8 illustrates a bottom pinned pSTTM stack that uses the single alloy and an insert layer as a bi-layer free layer.

FIG. 8 illustrates a bottom pinned pSTTM stack 800 that uses the single alloy 130 and an insert layer 805 as a bi-layer free layer 110. The pSTTM stack 800 may be an example of the pSTTM stack 100 illustrated with respect to FIG. 1, except for the addition of the insert layer 805 between the single alloy 130 and the tunnel barrier 135. In one example, the insert layer 805 may be a very thin layer of CoFeB. In some embodiments, an alternative magnetic alloy may be used. In some cases, a very thin layer of CoFeB can be accomplished by having a zero ratio (i.e., x=0) for a short period of time before or after having a non-zero ratio for a longer period of time.

Figure 9:
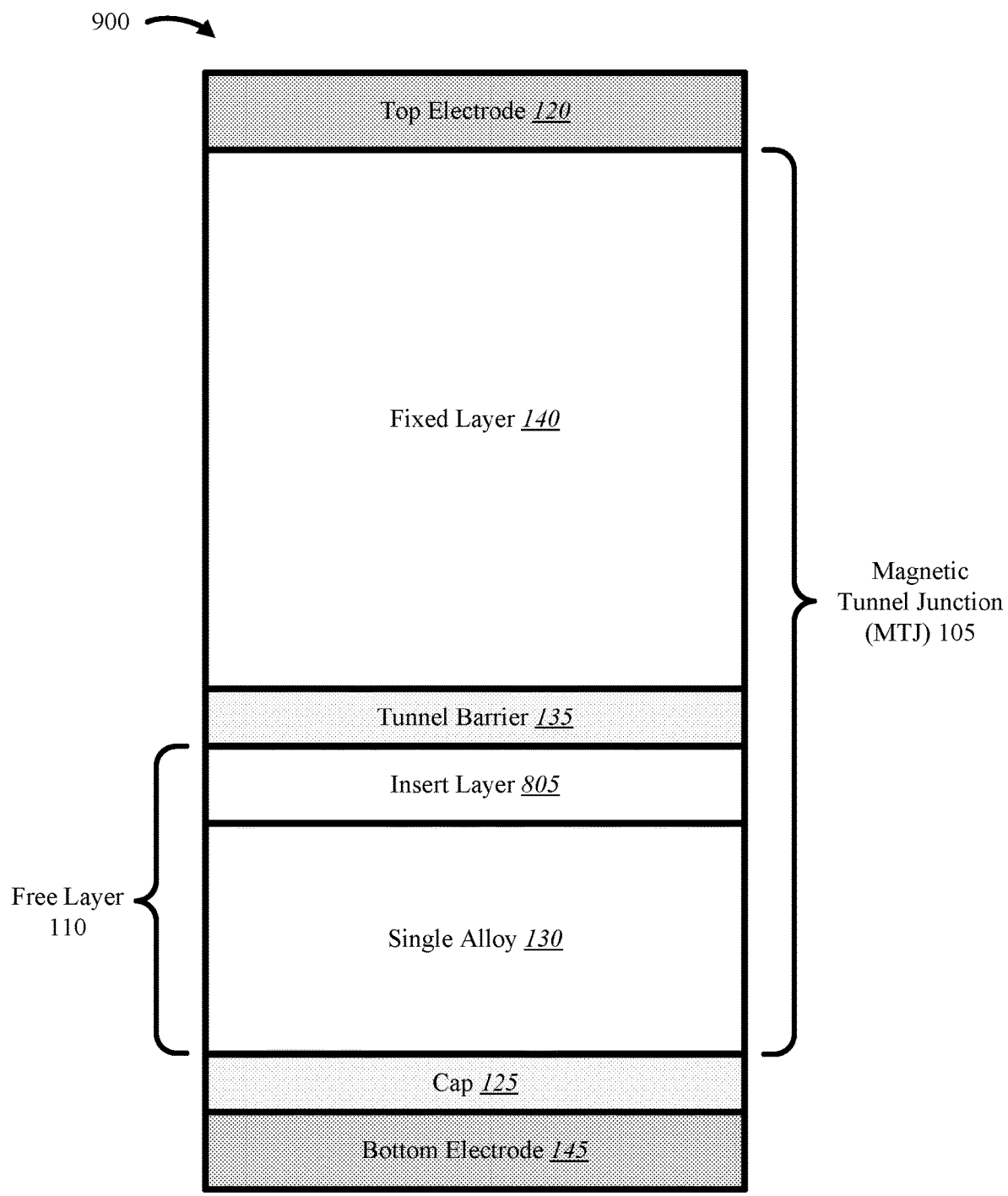
FIG. 9 illustrates a top pinned pSTTM stack that uses the single alloy and an insert layer as a bi-layer free layer.

FIG. 9 illustrates a top pinned pSTTM stack 900 that uses the single alloy 130 and the insert layer 805 as a bi-layer free layer 110. The pSTTM stack 900 may be an example of the pSTTM stack 200 illustrated with respect to FIG. 2. It is understood that different configurations (e.g., top pinned versus bottom pinned) may be beneficial based on the unique design considerations for a given application.

Figure 10:
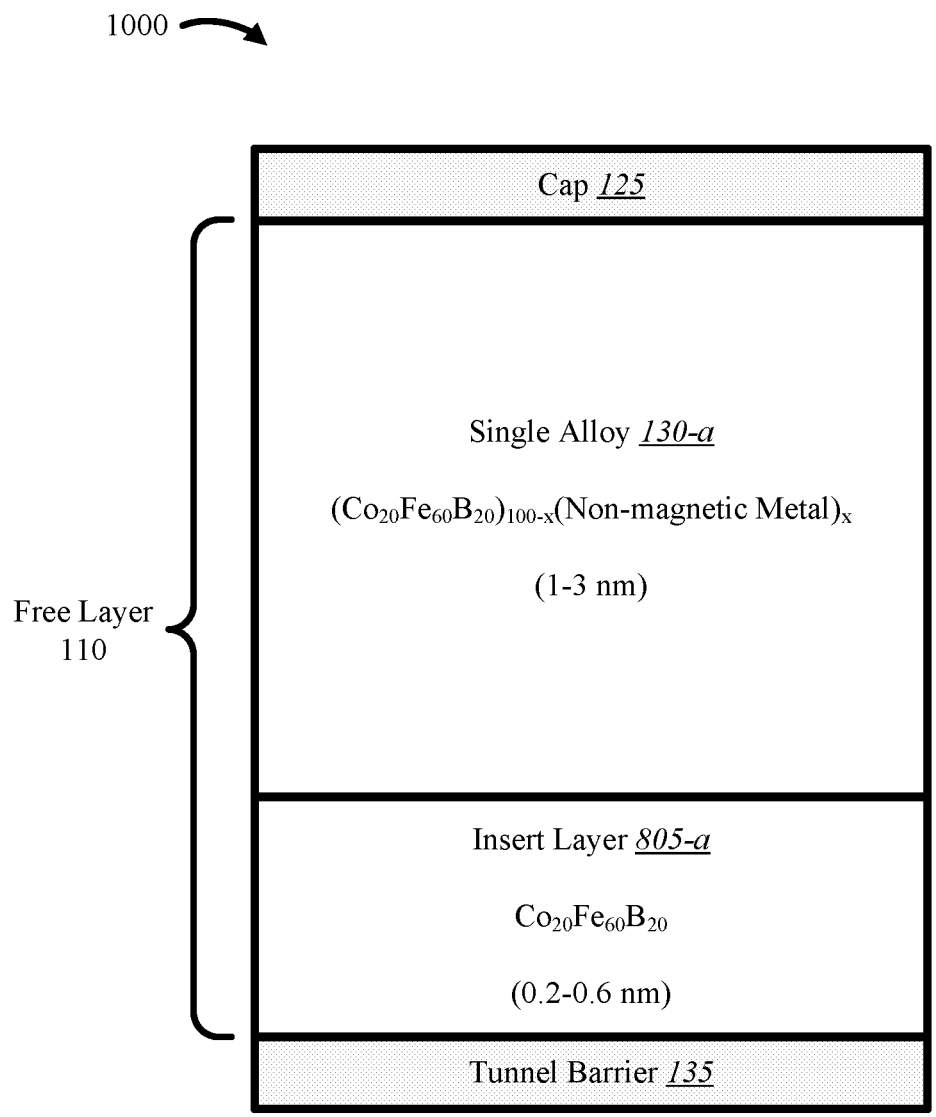
FIG. 10 illustrates a bi-layer free layer stack that includes the single alloy and the insert layer between a cap and the tunnel barrier.

FIG. 10 illustrates a bi-layer free layer stack 1000 that includes the single alloy 130-a and the insert layer 805-a between the cap 125 and the tunnel barrier 135. The single alloy 130-a is an example of the single alloy 130 illustrated with respect to FIGS. 1, 2, 8, and/or 9. The single alloy 130-a is composed of the new alloy that is formed by combining CoFeB with a non-magnetic metal according to a specific ratio. As discussed previously, the non-magnetic metal may be any of a variety of non-magnetic metals, including Molybdenum (Mo), Tungsten (W), Hafnium (Hf), Niobium (Nb), Chromium (Cr), and Tantalum (Ta). In this example, the single alloy 130-a has a thickness of 1 to 3 nm.

The insert layer 805-a is an example of the insert layer 805 illustrated with respect to FIGS. 8 and/or 9. The insert layer 805-a is composed of a magnetic alloy that is formed from CoFeB (e.g., $Co_{20}Fe_{60}B_{20}$). In this example, the insert layer 805-a has a thickness of 0.2 to 0.6 nm (inclusive).

Figure 11:
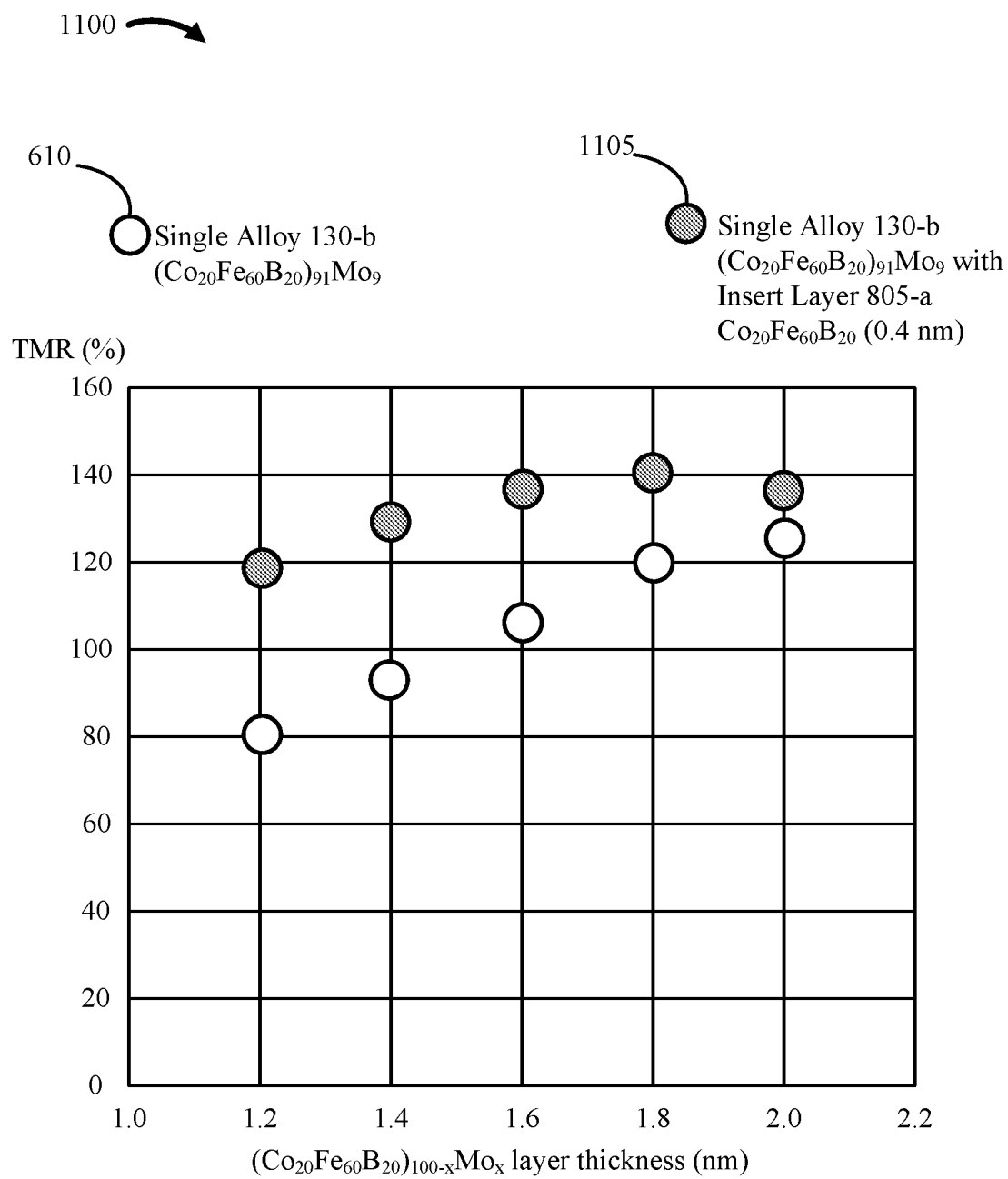
FIG. 11 illustrates a graph of tunnel magnetoresistance (TMR) with respect to $(Co_{20}Fe_{60}B_{20})_{100-x}Mo_x$ thickness for both the single layer free layer of the single alloy and the bi-layer free layer of the single alloy and the insert layer that is 0.4 nm in thickness.

FIG. 11 illustrates a graph 1100 of tunnel magnetoresistance (TMR) with respect to $(Co_{20}Fe_{60}B_{20})_{100-x}Mo_x$ thickness for both a single layer free layer 610 of the single alloy 130-b and a bi-layer free layer 1105 of the single alloy 130-b and an insert layer 805-a that is 0.4 nm in thickness. As illustrated in the graph 1100 the bi-layer free layer 1105 achieves TMR values that are consistent with the TMR values associated with prior art tri-layer free layers (as discussed previously with respect to FIG. 7, for example).

Thus, the single layer free layer formed of the single alloy 130 provides superior stability (due to better $M_s$ values and thicker films, for example) over the currently used tri-layer free layer while providing slightly lower, although acceptable, TMR values. Additionally, the bi-layer free layer formed by inserting the very thin insert layer 805 between the single alloy 130 and the tunnel barrier 135 provides the same or substantially the same superior stability while maintaining TMR values that are on par with current approaches (e.g., the prior art tri-layer approach).

Figure 12:
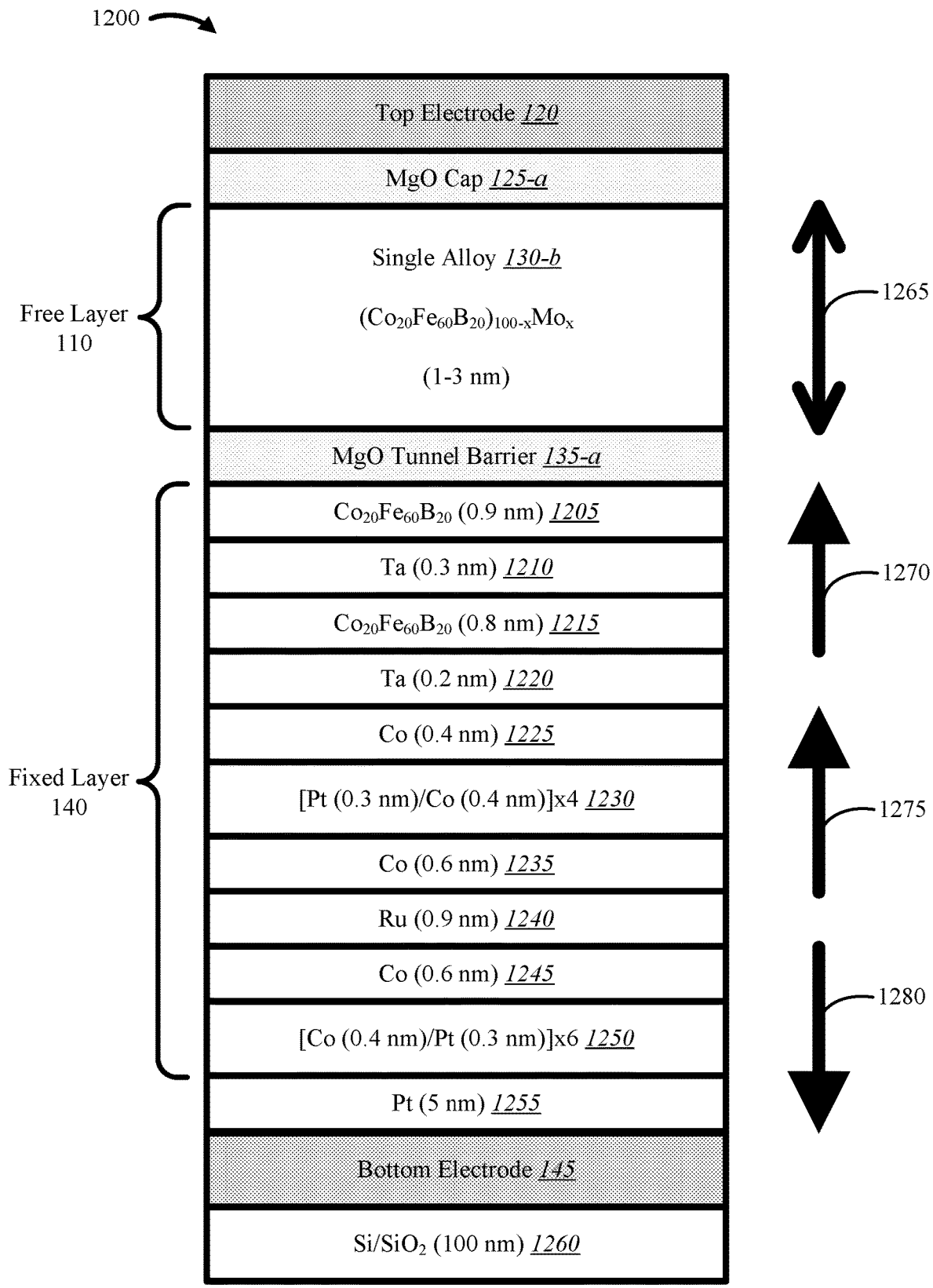
FIG. 12 illustrates one example of a bottom pinned pSTTM in which the present systems and methods may be applied.

FIG. 12 illustrates one example of a bottom pinned pSTTM 1200 in which the present systems and methods may be applied. The bottom pinned pSTTM 1200 of FIG. 12 is an example of the bottom pinned pSTTM 100 illustrated in FIG. 1 except that the fixed layer 140 has been defined in terms of layers and the magnetization of different layers is illustrated.

The bottom pinned pSTTM 1200 includes a MgO cap 125-a between the top electrode 120 and the single alloy 130-b. The MgO cap 125-a is an example of the cap 125 described previously. In some cases, the cap 125 (e.g., MgO cap 125-a) may be referred to as a tunnel barrier (e.g., tunnel barrier 135). It is appreciated that in this example, that both the MgO cap 125-a and the MgO tunnel barrier 135-a are formed of the same material (e.g., MgO). Although, it is appreciated that they could be formed of different materials without affecting their use as tunnel barriers. The MgO cap 125-a consists of Magnesium oxide (MgO), which may be formed by oxidizing Magnesium (Mg) as it is being deposited (on the top electrode 120 or the single alloy 130-b, for example). Although, in this example an MgO cap 125-a is used, the cap 125 could be formed from any of a number of metal oxides, including Tantalum oxide (TaOx), Aluminum oxide (AlOx), Tungsten oxide (WOx), and Hafnium oxide (HfOx).

The single alloy 130-b is formed of a $(Co_{20}Fe_{60}B_{20})_{100-x}Mo_x$ alloy that is combined (e.g., co-sputtered) according to a particular ratio (e.g., a particular x). The single alloy 130-b is between 1 and 3 nm in thickness. The single alloy 130-b interfaces directory with the MgO cap 125-a and the MgO tunnel barrier 135-a.

The MgO tunnel barrier 135-a may be an example of the tunnel barrier 135 described previously. Similar to the MgO cap 125-a, the MgO tunnel barrier 135-a consists of Magnesium oxide (MgO) and may be formed by oxidizing Magnesium (Mg) as it is being deposited. Although, in this example an MgO tunnel barrier 135-a is used, the tunnel barrier 135 could be formed from any of a number of metal oxides, including Tantalum oxide (TaOx), Aluminum oxide (AlOx), Tungsten oxide (WOx), and Hafnium oxide (HfOx).

The fixed layer 140 includes various layers that work together in groups to create a reference layer, a hard layer, and a seed layer. The reference layer begins immediately below the MgO tunnel barrier 135-a and includes a CoFeB layer 1205, Tantalum (Ta) layer 1210, CoFeB layer 1215, Tantalum (Ta) layer 1220, Cobalt (Co) layer 1225, a four layer sandwich of Platinum (Pt) and Cobalt (Co) 1230, and Cobalt (Co) layer 1235. A layer of Ruthenium (Ru) 1240 separates the reference layer from the hard layer.

The hard layer includes a Cobalt (Co) layer 1245, and a six layer sandwich of Cobalt (Co) and Platinum (Pt) 1250. A seed layer that consists of a Platinum (Pt) layer 1255 is between the bottom electrode 145 and the hard layer. The bottom electrode 145 is disposed on a semiconductor substrate (e.g., Silicon (Si) and/or Silicon oxide ($SiO_2$)) 1260.

As illustrated by arrow 1265, the free layer 110 is flippable between two magnetization states. The reference layer (as indicated by arrows 1270 and 1275) has a fixed magnetization in a first direction (e.g., up). Although the arrows 1265 to 1280 are illustrated as being up and down arrows (e.g., in-plane), this is for convenience sake only, as it is readily known by those skilled in the art that pSTTM uses perpendicular magnetization (i. e., the arrows would point side to side). The hard layer may have magnetization in a second direction as illustrated by arrow 1280. These different magnetization directions in the fixed layer enable polarization of currents as well as predictable magnetoresistive properties for proper operation of MTJs and/or pSTTM devices.

Figure 13:
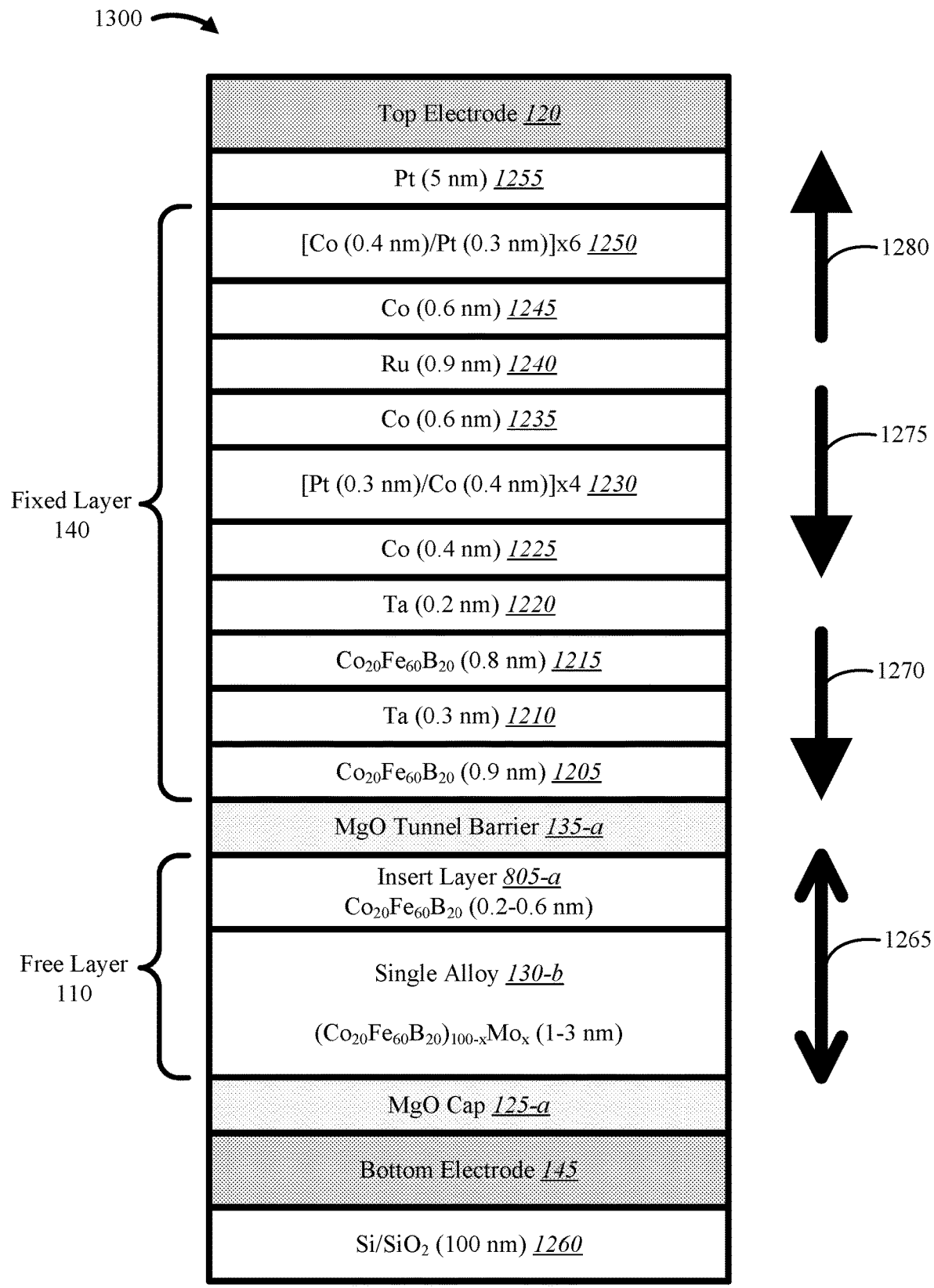
FIG. 13 illustrates one example of a top pinned pSTTM in which the present systems and methods may be applied.

FIG. 13 illustrates one example of a top pinned pSTTM 1300 in which the present systems and methods may be applied. The top pinned pSTTM 1300 is an example of the pSTTM 900 illustrated in FIG. 9 with the fixed layer 140 and magnetization defined as set forth with respect to FIG. 12.

Figure 14:
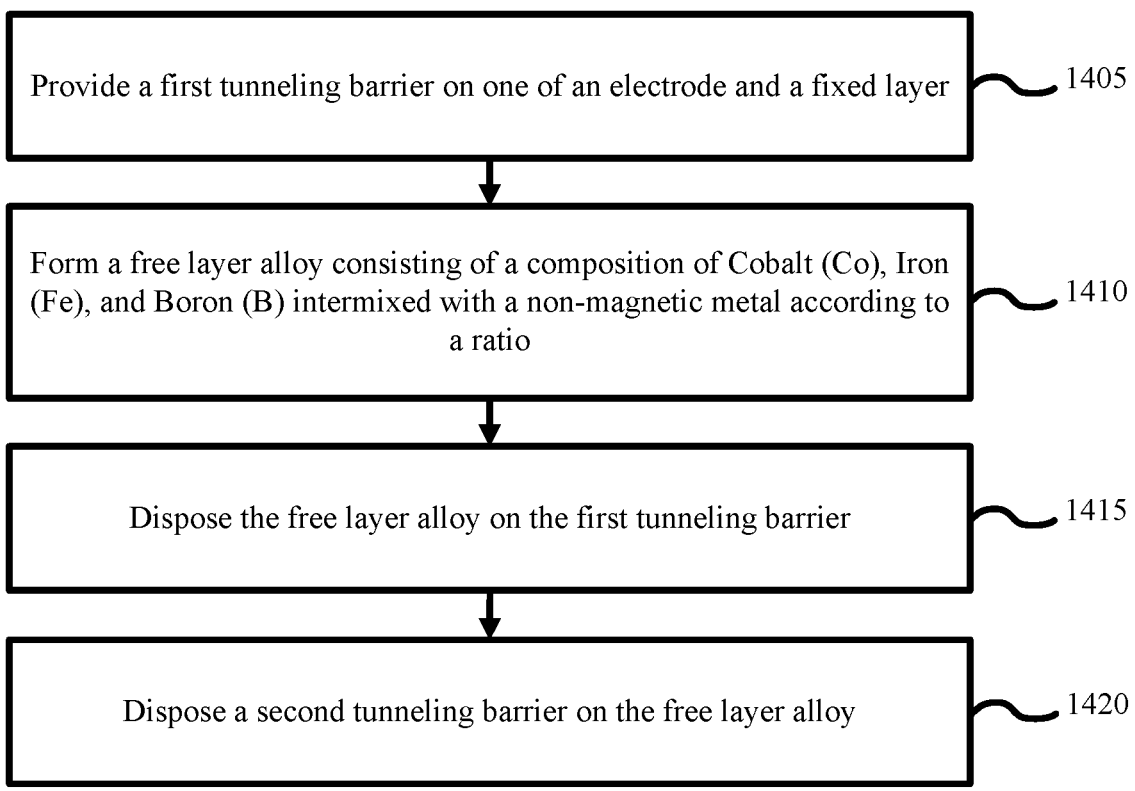
FIG. 14 illustrates a method of manufacture for a pSTTM free layer stack.

FIG. 14 illustrates a method 1400 of manufacture for a pSTTM free layer stack. At 1405 a first tunneling barrier is provided on one of an electrode and a fixed layer. At 1410, a free layer alloy consisting of a composition of Cobalt (Co), Iron (Fe), and Boron (B) intermixed with a non-magnetic metal is formed according to a ratio. At 1415, the free layer alloy is disposed on the first tunneling barrier. The free layer alloy may be disposed on the first tunneling barrier by co-sputtering the CoFeB with the non-magnetic material according to the ratio. In some cases, the co-sputtering is performed using physical vapor deposition (PVD). At 1420, a second tunneling barrier is disposed on the free layer alloy. In some embodiments, an insert layer is disposed between one of the first and second tunneling barriers and the free layer alloy.

Figure 15:
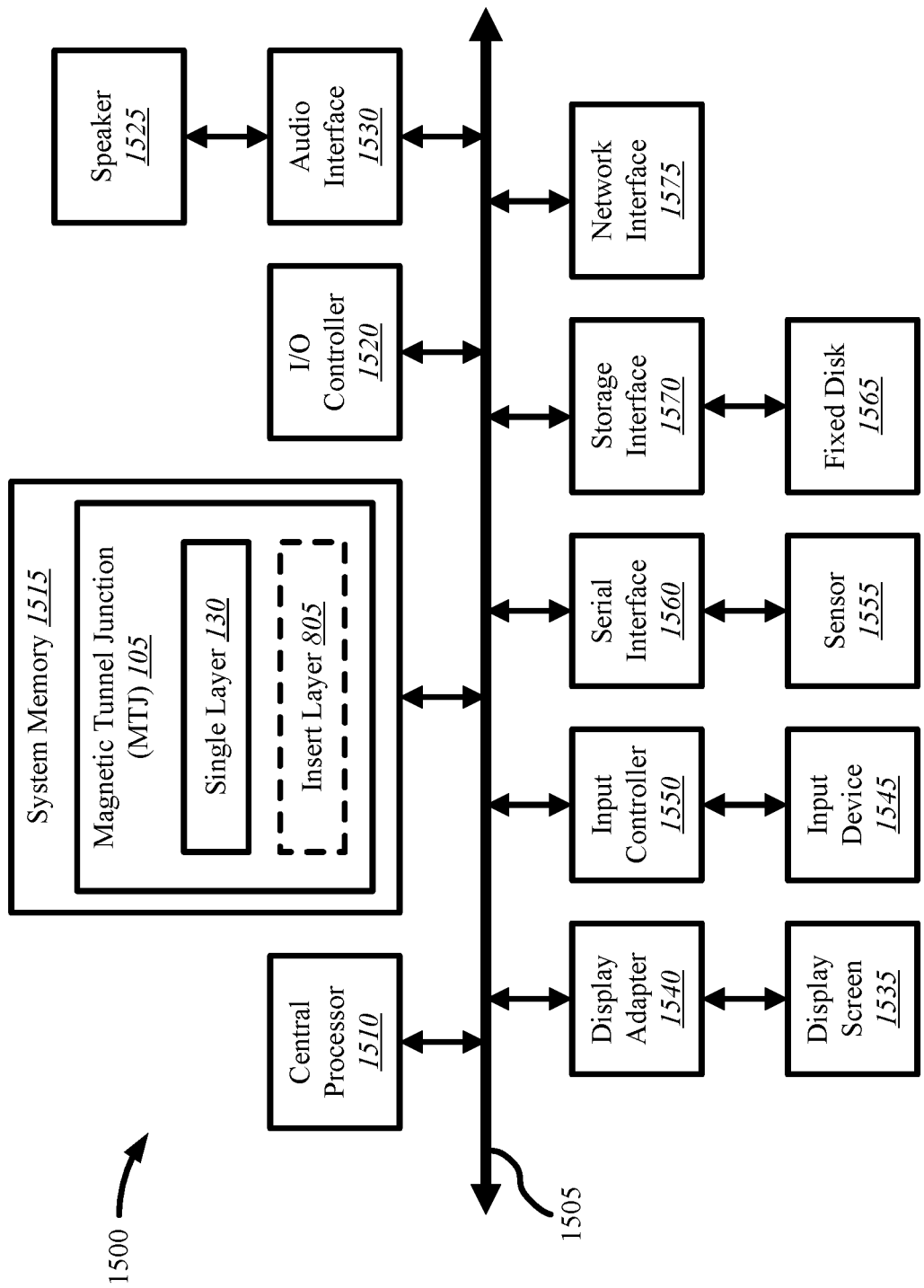
FIG. 15 depicts a block diagram of a computer system that incorporates the present systems and methods.

FIG. 15 depicts a block diagram of a computer system 1500 that incorporates the present systems and methods. The computer system 1500 includes a bus 1505 that interconnects major subsystems of the computer system 1500, such as a central processor 1510, a system memory 1515 (typically RAM, but which may also include ROM, flash RAM, embedded DRAM (eDRAM), SRAM, spin-transfer torque memory (STT-MRAM), or the like), an input/output (I/O) controller 1520, an external audio device, such as a speaker system 1525 via an audio output interface 1530, an external device, such as a display screen 1535 via a display adapter 1540, an input device 1545 (e.g., keyboard, touchpad, touch screen, voice recognition module, etc.) (interfaced with an input controller 1550), a sensor 1555 via a serial interface 1560, a fixed disk (or other storage medium, for example) 1565 via a storage interface 1570, and a network interface 1575 (coupled directly to the bus 1505).

The bus 1505 allows data communication between the central processor 1510 and the system memory 1515, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS), which controls basic hardware operation such as the interaction with peripheral components or devices. At least some portion of the system memory 1515 includes the MTJ 105 that includes the single layer 130 described herein. In some cases, the MTJ 105 may optionally include the insert layer 805. The MTJ 105 may be used as part of a pSTTM device or for another use where MTJs are applicable. In some cases, the system memory 1515 may have at least a portion of memory that includes pSTTM. Applications resident with the computer system 1500 are generally stored on and accessed via a non-transitory computer readable medium, such as a hard disk drive (e.g., the fixed disk 1565) or another storage medium. In some cases, one or more of these other storage mediums may include one or more MTJs 105 that include the single layer 130 and optionally the insert layer 805.

The storage interface 1570, as with the other storage interfaces of the computer system 1500, can connect to a standard computer readable medium for storage and/or retrieval of information, such as a fixed disk drive (e.g., the fixed disk 1565). The fixed disk drive 1565 may be a part of the computer system 1500 or may be separate and accessed through other interface systems. The network interface 1575 may provide a direct connection to a remote server via a direct network link to the Internet. The network interface 1575 may provide such connection using wireless techniques, including digital cellular telephone connection, Cellular Digital Packet Data (CDPD) connection, digital satellite data connection, or the like.

Many other devices or subsystems (not shown) may be connected in a similar manner. Conversely, all of the devices shown in FIG. 15 need not be present to practice the present systems and methods. The devices and subsystems can be interconnected in different ways from that shown in FIG. 15. The operation of a computer system such as that shown in FIG. 15 is readily known in the art and is not discussed in detail in this application.

In various embodiments, the computing system 1500 may be a laptop computer, a netbook computer, a notebook computer, an ultrabook computer, a smartphone, a dumbphone, a tablet, a tablet/laptop hybrid, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing system 1500 may be any other electronic device that processes data.

EXAMPLE EMBODIMENTS

Example 1 is an apparatus for magnetoresitive memory. The apparatus includes a fixed layer and a free layer, the free layer comprising an alloy consisting of a composition of Cobalt (Co), Iron (Fe), and Boron (B) intermixed with a non-magnetic metal according to a ratio, and a tunneling barrier between the fixed layer and the free layer.

Example 2 is the apparatus of Example 1, where the ratio of the non-magnetic metal to the composition of Co, Fe, and B is between 2% and 15%.

Example 3 is the apparatus of Example 1, where the ratio of the non-magnetic metal to the composition of Co, Fe, and B is between 8% and 10%.

Example 4 is the apparatus of Example 1, where the composition of Co, Fe, and B is $Co_{20}Fe_{60}B_{20}$.

Example 5 is the apparatus of Example 1, where the non-magnetic metal is selected from the group consisting of: Molybdenum (Mo), Tungsten (W), Hafnium (Hf), Niobium (Nb), Chromium (Cr), and/or Tantalum (Ta).

Example 6 is the apparatus of Example 5, where the alloy is $(Co_{20}Fe_{60}B_{20})_{100-x}Mo_x$, where x is the ratio.

Example 7 is the apparatus of Example 1, where the alloy is between 1 nanometer and 3 nanometers in thickness.

Example 8 is the apparatus of Example 1, where the free layer also includes a second alloy layer between the alloy and the tunneling barrier.

Example 9 is the apparatus of Example 8, where the second alloy layer increases a tunnel magnetoresistance (TMR) of the free layer.

Example 10 is the apparatus of Example 8, where the second alloy layer comprises a second composition of Co, Fe, and B.

Example 11 is the apparatus of Example 8, where the second alloy layer is between 0.2 nanometers and 0.6 nanometers in thickness.

Example 12 is the apparatus of Example 1, where the tunneling barrier consists of Magnesium oxide (MgO).

Example 13 is the apparatus of Example 1, where the alloy has perpendicular anisotropy, and where the perpendicular anisotropy is sustained at 400 degrees Celsius.

Example 14 is a method for manufacturing a magnetoresitive memory. The method includes providing a first tunneling barrier on one of an electrode (where it acts as a cap 125, for example) and a fixed layer (where it acts as a tunnel barrier 135, for example), forming a free layer alloy consisting of a composition of Cobalt (Co), Iron (Fe), and Boron (B) intermixed with a non-magnetic metal according to a ratio, disposing the free layer alloy on the first tunneling barrier, and disposing a second tunneling barrier (either a cap 125 or a tunneling barrier 135, depending on the stack structure, for example) on the free layer alloy.

Example 15 is the method of Example 14, where forming the free layer alloy and disposing the free layer alloy are performed using physical vapor deposition.

Example 16 is the method of Example 15, where forming the free layer alloy and disposing the free layer alloy include co-sputtering the composition of Co, Fe, and B with the non-magnetic metal according to the ratio.

Example 17 is the method of Example 14, where the ratio of the non-magnetic metal to the composition of Co, Fe, and B is between 2% and 15%.

Example 18 is the method of Example 14, where the ratio of the non-magnetic metal to the composition of Co, Fe, and B is between 8% and 10%.

Example 19 is the method of Example 14, where the composition of Co, Fe, and B is $Co_{20}Fe_{60}B_{20}$.

Example 20 is the method of Example 14, where the non-magnetic metal is selected from the group consisting of Molybdenum (Mo), Tungsten (W), Hafnium (Hf), Niobium (Nb), Chromium (Cr), and Tantalum (Ta).

Example 21 is the method of Example 20, where the free layer alloy is $(Co_{20}Fe_{60}B_{20})_{100-x}Mo_x$, where x is the ratio.

Example 22 is the method of Example 14, where the second tunneling barrier is selected from the group consisting of Magnesium oxide (MgO), Tantalum oxide (TaOx), Aluminum oxide (AlOx), Tungsten oxide (WOx), and Hafnium oxide (HfOx).

Example 23 is the method of Example 22, where disposing the second tunneling barrier on the free layer includes disposing a Magnesium (Mg) layer on the free layer in an Oxygen (O) rich environment to form the Magnesium oxide (MgO).

Example 24 is the method of Example 14, where disposing the free layer alloy on the first tunneling barrier includes disposing between 1 nanometer and 3 nanometers of the free layer alloy on the first tunneling barrier.

Example 25 is the method of Example 14, where the free layer alloy forms a single layer free layer.

Example 26 is the method of Example 14, further including forming an insert layer alloy consisting of Co, Fe, and B, and disposing the insert layer alloy on the free layer alloy prior to disposing the second tunneling barrier.

Example 27 is the method of Example 26, where the free layer and the insert layer in combination form a bi-layer free layer of the magnetoresitive memory.

Example 28 is the method of Example 26, where the insert layer alloy increases a tunnel magnetoresistance (TMR) of the free layer.

Example 29 is the method of Example 26, where disposing the insert layer alloy includes disposing between 0.2 nanometers and 0.6 nanometers of the insert layer alloy on the free layer alloy.

Example 30 is a computing device that includes a processor mounted on a substrate, and a memory unit capable of storing data. The memory unit includes a fixed layer and a free layer, the free layer comprising an alloy consisting of a composition of Cobalt (Co), Iron (Fe), and Boron (B) intermixed with a non-magnetic metal according to a ratio, and a tunneling barrier between the fixed layer and the free layer.

Example 31 is the computing device of Example 30, where the ratio of the non-magnetic metal to the composition of Co, Fe, and B is between 2% and 15%.

Example 32 is the computing device of Example 30, where the ratio of the non-magnetic metal to the composition of Co, Fe, and B is between 8% and 10%.

Example 33 is the computing device of Example 30, where the composition of Co, Fe, and B is $Co_{20}Fe_{60}B_{20}$.

Example 34 is the computing device of Example 30, where the non-magnetic metal is selected from the group consisting of Molybdenum (Mo), Tungsten (W), Hafnium (Hf), Niobium (Nb), Chromium (Cr), and Tantalum (Ta).

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

The invention claimed is:

1. An apparatus for magnetoresitive memory, the apparatus comprising:
    a fixed layer;
    a free layer, the free layer being a single layer consisting of an alloy consisting of a composition of Cobalt (Co), Iron (Fe), and Boron (B) intermixed with a non-magnetic metal according to a ratio;
    a tunneling barrier between the fixed layer and the free layer, the free layer directly on the tunneling barrier; and
    a cap layer directly on the free layer.

2. The apparatus of claim 1, wherein the ratio of the non-magnetic metal to the composition of Co, Fe, and B is between 2% and 15%.

3. The apparatus of claim 1, wherein the ratio of the non-magnetic metal to the composition of Co, Fe, and B is between 8% and 10%.

4. The apparatus of claim 1, wherein the composition of Co, Fe, and B is selected from the group consisting of:
    $Co_{20}Fe_{60}B_{20}$;
    $Co_{60}Fe_{20}B_{20}$;
    $Co_{40}Fe_{40}B_{20}$;
    $Co_{10}Fe_{70}B_{20}$; and
    $Co_{0}Fe_{80}B_{20}$.

5. The apparatus of claim 1, wherein the non-magnetic metal is selected from the group consisting of:
    Molybdenum (Mo);
    Tungsten (W);
    Hafnium (Hf);
    Niobium (Nb);
    Chromium (Cr); and
    Tantalum (Ta).

6. The apparatus of claim 5, wherein the alloy is $(Co_{20}Fe_{60}B_{20})_{100-x}Mo_x$, where x is the ratio.

7. The apparatus of claim 1, wherein the alloy is between 1 nanometer and 3 nanometers in thickness.

8. The apparatus of claim 1, wherein the tunneling barrier comprises Magnesium oxide (MgO).

9. The apparatus of claim 1, wherein the alloy has perpendicular anisotropy, and wherein the perpendicular anisotropy is sustained at 400 degrees Celsius.

10. A computing device, comprising:
    a processor mounted on a substrate; and
    a memory unit capable of storing data, the memory unit comprising:
        a fixed layer;
        a free layer, the free layer being a single layer consisting of an alloy consisting of a composition of Cobalt (Co), Iron (Fe), and Boron (B) intermixed with a non-magnetic metal according to a ratio;
        a tunneling barrier between the fixed layer and the free layer, the free layer directly on the tunneling barrier; and
        a cap layer directly on the free layer.

11. The computing device of claim 10, wherein the ratio of the non-magnetic metal to the composition of Co, Fe, and B is between 2% and 15%.

12. The computing device of claim 10, wherein the ratio of the non-magnetic metal to the composition of Co, Fe, and B is between 8% and 10%.

13. An apparatus for magnetoresitive memory, the apparatus comprising:
    a fixed layer;
    a free layer, the free layer being a single layer consisting of an alloy consisting of a composition of Cobalt (Co), Iron (Fe), and Boron (B) intermixed with a non-magnetic metal according to a ratio, wherein the non-magnetic metal is selected from the group consisting of Tungsten (W), Hafnium (Hf) and Niobium (Nb); and
    a tunneling barrier between the fixed layer and the free layer.

14. The apparatus of claim 13, wherein the non-magnetic metal is Tungsten (W).

15. The apparatus of claim 13, wherein the non-magnetic metal is Hafnium (Hf).

16. The apparatus of claim 13, wherein the non-magnetic metal is Niobium (Nb).

* * * * *